United States Patent
Roizin et al.

(10) Patent No.: US 11,081,613 B2
(45) Date of Patent: Aug. 3, 2021

(54) GALLIUM NITRIDE BASED ULTRA-VIOLET SENSOR WITH INTRINSIC AMPLIFICATION AND METHOD OF OPERATING SAME

(71) Applicant: Tower Semiconductor Ltd., Migdal Haemek (IL)

(72) Inventors: Yakov Roizin, Afula (IL); Carmel Sahar, Haifa (IL); Victor Kairys, Karmiel (IL); Ruth Shima-edelstein, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 229 days.

(21) Appl. No.: 16/535,548

(22) Filed: Aug. 8, 2019

(65) Prior Publication Data
US 2021/0043793 A1     Feb. 11, 2021

(51) Int. Cl.
*H01L 31/112*      (2006.01)
*G01J 1/42*        (2006.01)
*H01L 31/0304*     (2006.01)
*H01L 31/024*      (2014.01)

(52) U.S. Cl.
CPC .......... *H01L 31/1123* (2013.01); *G01J 1/429* (2013.01); *H01L 31/024* (2013.01); *H01L 31/03048* (2013.01)

(58) Field of Classification Search
None
See application file for complete search history.

(56) References Cited

U.S. PATENT DOCUMENTS 6,137,123 A     10/2000 Yang et al.
9,207,203 B2 *  12/2015 Vitushinsky ....... G01N 27/4141
(Continued)

OTHER PUBLICATIONS

Hou, Minmin et al., "Suppression of Persistent Photoconductivity in AlGaN/GaN Ultraviolet Photodetectors Using In Situ Heating", IEEE Electron Device Letters, vol. 38, No. 1, Jan. 2017, 4 pages.
(Continued)

*Primary Examiner* — David P Porta
*Assistant Examiner* — Meenakshi S Sahu
(74) *Attorney, Agent, or Firm* — Bever, Hoffman & Harms, LLP

(57) ABSTRACT

A UV sensor includes a GaN stack including a low-resistance GaN layer formed over a nucleation layer, and a high-resistance GaN layer formed over the low-resistance GaN layer, wherein a 2DEG conductive channel exists at the upper surface of the high-resistance GaN layer. An AlGaN layer is formed over the upper surface of the high-resistance GaN layer. A source contact and a drain contact extend through the AlGaN layer and contact the upper surface of the high-resistance GaN layer (and are thereby electrically coupled to the 2DEG channel). A drain depletion region extends entirely from the upper surface of the high-resistance GaN layer to the low-resistance GaN layer under the drain contact. An electrical current between the source and drain contacts is a function of UV light received by the GaN stack. An electrode is connected to the low-resistance GaN layer to allow for electrical refresh of the UV sensor.

35 Claims, 11 Drawing Sheets

(56) References Cited

U.S. PATENT DOCUMENTS 9,780,239 B2 * 10/2017 Forcier ............... H01L 31/1035
10,128,398 B1 11/2018 Forcier et al.

OTHER PUBLICATIONS

Koller, C., et al., "Evidence of defect band in carbon-doped GaN controlling leakage current and trapping dynamics", 978-1-5386-3559-9/17, 2017 IEEE, 4 pages.

Van De Walle, Chris G., et al., "Theory of doping and defects in III-V nitrides", Journal of Crystal Growth 189/190 (1998) Elsevier Science B.V., pp. 505-510 (6 pages).

Xu, Z.Y, et al., "High-resistance GaN epilayers with low dislocation density via growth mode modification", Journal of Crystal Growth 451 (2016) Elsevier B.V., pp. 160-163, 4 pages.

Zaidi, Zaffar H., et al., "Highly Sensitive UV Detection Mechanism in AlGaN/GaN HEMTs", IEEE Transactions on Electron Devices, vol. 60, No. 9, Sep. 2013, 6 pages.

* cited by examiner

GALLIUM NITRIDE BASED ULTRA-VIOLET SENSOR WITH INTRINSIC AMPLIFICATION AND METHOD OF OPERATING SAME

FIELD OF THE INVENTION

The present invention relates to Gallium-Nitride (GaN) based Ultra-Violet (UV) sensors and methods for operating these sensors.

RELATED ART

AlGaN/GaN based ultraviolet (UV) solar blind (not sensitive to visible and infra-red (IR) radiation) photo detectors, are used for sensing solar UV radiation, diagnostics of flame, UV imaging, optical communications and other applications. UV sensors, featuring GaN and AlGaN photo conductors and photo diodes (both Schottky and P-N junctions) have been extensively reported. GaN stacks used in UV sensors have been grown by molecular beam or metal organic chemical vapor deposition (MOCVD) epitaxy on different substrates. For example, some UV sensors have been implemented using GaN stacks that are fabricated on silicon substrates, which are much cheaper than GaN stacks fabricated on sapphire or silicon carbide (SiC). For example, a UV light sensor and method of manufacturing the same are disclosed in U.S. Pat. Nos. 10,128,389 and 9,780,239 to Forcier et al. (hereinafter, the Forcier '389 and '239 patents). This UV light sensor includes GaN layers adjacent to a silicon wafer with one of the GaN layers at least partially exposed, such that a surface thereof can receive UV light to be detected. This UV light sensor includes a p-type GaN layer and an n-type GaN layer, with P-N junctions there between forming at least one diode. The main drawback of the UV light sensor disclosed by the Forcier '389 and '239 patents is low sensitivity. For low light level applications, the photodiode of the Forcier '389 and '239 patents typically cannot produce adequate signal levels for the associated read-out electronics.

To increase sensitivity, some attention has been given to avalanche photodiodes (APD). Typically, a high leakage current is incurred in a GaN p-n junction before it reaches the avalanche breakdown (most likely due to the high defect density in Group-III nitride materials). This high leakage current limits the application of GaN APD in UV sensing.

Another approach to increase UV sensitivity is to use phototransistors. An AlGaN/GaN heterojunction bipolar phototransistor having an AlGaN contact, an i-GaN absorbing layer, a p-GaN base and a n-GaN emitter, formed in that order on a UV transparent substrate has been suggested in U.S. Pat. No. 6,137,123 to Yang et al. (hereinafter, the Yang '123 patent). For a range of (UV) wavelengths of 360 nm to 400 nm, the device described by the Yang '123 patent achieved eight orders of magnitude drop in responsivity. Although this device has shown high photo current gains, the issues of persistent photoconductivity (PPC) limit its application. The PPC phenomenon is typical for all GaN detectors. One of the PPC explanations is related to electron excitation from traps and remaining positive charge in GaN bulk (trapped holes). The phenomenon makes DC measurements, and hence practical sensing devices, difficult due to photocurrent drifts, rendering these devices useful only in very low speed operation. PPC can be suppressed in AlGaN/GaN photodetectors using heating (e.g., as described by M. Hou, et al. in 'Suppression of Persistent Photoconductivity in AlGaN/GaN Ultraviolet Photodetectors Using in situ Heating'. IEEE EDL, Vol. 38, No. 1, 2017). However, this heating implies the need of special heaters and placing the devices on low-mass membranes, which significantly complicates the technology and increases the device cost.

Most of above-mentioned diode-based GaN UV sensing solutions require P-type doped GaN layers, which are formed by doping GaN layers with large concentrations of Magnesium (Mg). However, the use of Mg doping in CMOS fabs is prohibited because of associated contamination issues. For this reason, diode-based GaN UV sensing devices are typically not fabricated in a CMOS fab (i.e., on a silicon substrate). Typical solar blind UV sensors (like those described by the Yang '123 patent) are very expensive, because they utilize expensive substrate materials, such as silicon carbide and sapphire, which are transparent to UV radiation.

"Highly sensitive UV detection Mechanism in AlGaN/GaN HEMTs" was reported in Z. H. Zaidi, et al., IEEE Transactions on Electron Devices 60(9) September 2013. Zaidi demonstrated AlGaN/GaN high electron mobility transistors having a high DC responsivity (~4.3×10$^7$ A/W) to UV light. The gain mechanism of these transistors was connected with a photo voltage effect near the HEMT gate edge and was attributed to trapped surface electrons, which were neutralized by the movement of holes generated by UV towards the surface. These transistors operate in the regime of HEMT current quenching, and thus exhibit poor stability.

Moreover, due to the presence of an intrinsic AlGaN barrier layer in the transistors of Zaidi, a 2-dimensional electron gas (2DEG) channel charge is present, which results in a very high dark current level, making absolute intensity detection difficult. Operating the transistor of Zaidi in the pinch-off state can reduce the dark current level, but under these conditions the gain (photo response) is limited due to the collapse of transconductance. Zaidi teaches that in order to realize transistors with low dark current levels, enhancement mode transistors need to be employed. A fluorine implant based enhancement mode transistor may provide a high photo response to UV light, but such a transistor is unsuitable because of persistent photoconductivity effect and time delay associated with trapping effects.

U.S. Pat. No. 9,207,203 to Vitushinsky et al. describes a sensor for detecting a gas or liquid, wherein the sensor includes an AlGaN/GaN stack formed on an AlN nucleation layer, a confined back gate formed by a doped semiconductor bottom layer located under the AlN nucleation layer, and a silicon substrate located under the back gate. In the described embodiment, the doped semiconductor bottom layer is doped by Al impurities originating from the overlying AlN nucleation layer. This gate was used to control the density of electrons in 2DEG (two-dimensional electron gas). The back gate was contacted through an opening in the GaN stack.

It would therefore be desirable to have a UV sensor that has a high sensitivity and is able to overcome the issues of persistent photoconductivity (PPC). It would also be desirable for such a TV sensor to be inexpensive to fabricate.

SUMMARY

Accordingly, the present invention provides an AlGaN/GaN UV sensor that exhibits extra-high responsivity and allows electrical refresh to compensate for persistent photoconductivity effects which limit the operation of known GaN UV sensors (of the 'diode' and 'resistor' types). The UV sensor may be placed on a low-mass membrane with a heater, thereby allowing for faster operation (by using a combination of heating and electrical refresh).

In a particular embodiment, a UV light sensor includes a gallium nitride (GaN) stack including a low-resistance GaN layer formed over a nucleation layer, and an high-resistance GaN layer formed over the low-resistance GaN layer. An aluminum gallium nitride (AlGaN) layer is formed over the upper surface of the upper GaN layer. A two-dimensional electron gas (2DEG) conductive channel exists at the upper surface of the high-resistance GaN layer. A source contact and a drain contact extend through the AlGaN layer and contact the upper surface of the high-resistance GaN layer, whereby the source contact and drain contact are electrically coupled to the 2DEG conductive channel. A drain depletion region extends from the upper surface of the high-resistance GaN layer to the low-resistance GaN layer under the drain contact. An electrical current between the source contact and the drain contact is a function of UV light received by the GaN stack.

In various embodiments, the nucleation layer is formed over a substrate formed of silicon, sapphire, silicon carbide or a flexible substrate.

In one embodiment, an electrical contact is provided to the low-resistance GaN layer, thereby providing for the electrical refresh of the UV sensor. The electrical contact can be provided to the low-resistance GaN layer from either the front side of the UV sensor or the back side of the UV sensor.

In another embodiment, a heater can also be provided to heat the GaN stack during refresh of the UV sensor. The heater can be implemented by a separate 2DEG conductive channel in the high-resistance GaN layer, or by a resistor element fabricated over an upper surface of the UV light sensor. In one embodiment, the heater is located in a region having a low thermal mass.

The source and drain contacts can have various shapes, including (but not limited to) rectangular, rectangular with interdigitated fingers, and doughnut-shaped. In one embodiment the source contact and the drain contact are separated by a distance of about 1 um to 1000 um.

In accordance with another embodiment, the low-resistance GaN layer is replaced with a second 2DEG conductive channel that exists at the lower surface of the high-resistance GaN layer.

In accordance with another embodiment, a method of operating a UV light sensor includes: (1) applying a first voltage across a source contact and a drain contact located on a high-resistance gallium nitride (GaN) layer, wherein the high-resistance GaN layer is located on a low-resistance GaN layer, and wherein a two-dimensional electron gas (2DEG) conductive channel exists at the upper surface of the high-resistance GaN layer, wherein the first voltage results in the formation of a drain depletion region that extends from the upper surface of the high-resistance GaN layer to the low-resistance GaN layer under the drain contact; then (2) measuring an electrical current between the source contact and the drain contact while the first voltage is applied across the source contact and the drain contact, wherein the electrical current is a function of UV light received by the high-resistance and low-resistance GaN layers; and then (3) refreshing the UV light sensor by applying a second voltage to the low-resistance GaN layer when no electrical current is flowing between the source contact and the drain contact.

In one embodiment, refreshing the UV light sensor further comprises forcing current through a heater to increase the temperature of high-resistance and low-resistance GaN layers.

The present invention will be more fully understood in view of the following description and drawings.

DETAILED DESCRIPTION

In general, the present invention provides a UV sensor that includes a multi-layer GaN stack formed on a nucleation layer. The GaN stack includes a bottom low-resistance GaN layer formed on the nucleation layer, and a top high-resistance GaN layer formed on the bottom low-resistance GaN layer. An AlGaN barrier layer is formed over the GaN stack. A two-dimensional electron gas (2DEG) conductive channel is formed at the upper surface of top high-resistance GaN layer. Source and drain contacts extend through the AlGaN barrier layer to the top high-resistance GaN layer, thereby providing electrical contacts to the 2DEG channel. A drain depletion region in the top high-resistance GaN layer (below the drain contact) extends all the way to the bottom low-resistance GaN layer. When a voltage is applied across the source and drain contacts, the electrical current flowing between the source and drain contacts is a function of the ultraviolet light received by the GaN stack.

The UV sensor operates in current sublinear or drain saturation mode. UV light absorption in the GaN stack increases the drain depletion region conductivity, so that the voltage drop on the drain depletion region decreases. This creates an intrinsic amplification mechanism resulting in a significant (mA to tens of mA range) increase of the current between source and drain contacts.

The operation method consists of applying a voltage to the UV sensor and measuring the increase of the electrical current between source and drain contacts under UV irradiation with respect to the drain current value in the dark (i.e., the absence of UV irradiation). To eliminate the influence of persistent photoconductivity effects, the UV sensor is electrically refreshed by applying a voltage to the bottom low-resistance GaN layer. In one embodiment, the electrical refresh operation can be enhanced by heating the GaN stack.

The present invention will now be described in more detail.

Figure 1:
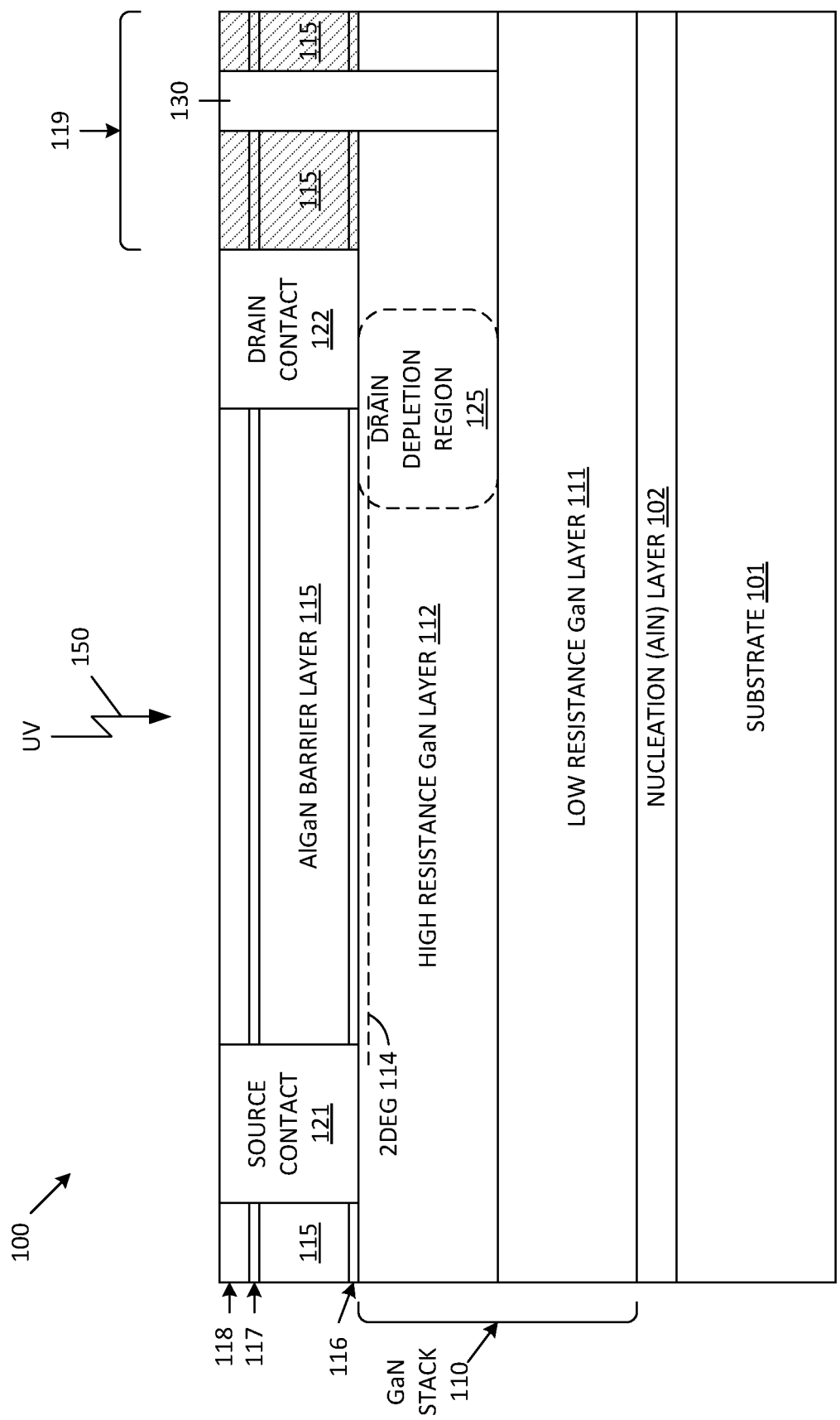
FIG. 1 is a cross-sectional view of a UV sensor in accordance with one embodiment of the present invention.

FIG. 1 is a cross-sectional view of a UV sensor 100 in accordance with one embodiment of the present invention. As illustrated by FIG. 1, UV sensor 100 is fabricated on a substrate 101. In the described embodiments, substrate 101 is monocrystalline silicon, advantageously reducing the costs associated with fabricating UV sensor 100. However, in other embodiments, substrate 101 can be sapphire, silicon carbide (SiC), or a flexible material. Nucleation layer 102 is formed on the upper surface of substrate 101. In the described embodiments, nucleation layer 102 is aluminum nitride (AlN). The composition of nucleation layer is selected to compensate for the mismatch of lattice constants between the substrate 101 and the subsequently formed low-resistance GaN layer 111.

A GaN stack 110, which includes two GaN layers 111-112, is formed over nucleation layer 102. More specifically, a doped (n-type) low resistance GaN layer 111 is formed on the nucleation layer 102. MOCVD epitaxy is used to grow GaN layer 111 on this seed layer 102, wherein the low resistance GaN layer 111 is doped unintentionally (i.e., external dopants are not added during the epitaxial growth of GaN layer 111). The unintentional doping occurs at high epitaxial growth temperatures (greater than 1000° C.), wherein diffusion of silicon and oxygen into the growing GaN layer 111, as well as diffusion of aluminum from the AlN nucleation layer 102 occur. If substrate 101 is not silicon (e.g., substrate 101 is sapphire or SiC), the low resistance GaN layer 111 can be intentionally doped during the formation of this layer 111. This can be done, for example, by in-situ doping during growth of GaN layer 111.

High-resistance GaN layer 112 is formed on top of low-resistance GaN layer 111, as illustrated. In one embodiment, high-resistance GaN layer 112 is formed by adding carbon (C) during the epitaxial growth of the GaN stack 110. In other embodiments, high-resistance GaN layer 112 is formed by other methods, such as diminishing the oxygen impurity level during the growth of GaN stack 110.

As described above, GaN layer 111 exhibits a lower resistance than GaN layer 112. In a particular embodiment, GaN layer 111 exhibits a resistance in the range of about 1 kOhm/sq to 1 MOhm/sq, and GaN layer 112 exhibits a resistance in the range of about 1 MOhm/sq to 1 TOhm/sq. Other resistances are possible in other embodiments. In the described embodiments, GaN stack 110 is grown to a thickness in the range of about 0.5 to 6 microns. In these embodiments, low-resistance GaN layer 111 may have a thickness in the range of about 0.1 to 1 microns, and high-resistance GaN layer 112 may have a thickness in the range of about 1 to 5 microns.

An AlGaN barrier layer 115 is formed on top of the GaN stack 110. A 2DEG confined conductive channel 114 is formed at the upper surface of the high-resistance GaN layer 112, adjacent to the AlGaN barrier layer 115. The formation of 2DEG channel 114 is a result of (i) band diagram of AlGaN—GaN potential well for electrons due to mismatch of conduction band edges, and (ii) piezoelectric polarization and the resulting high electric field in the AlGaN barrier layer. In one embodiment, 2DEG conductive channel 114 is formed during the stack growth-MOCVD process, and has a sheet resistance about 500 Ohm/sq.

An optional AlN layer 116, having a thickness of 1-2 nm, can be formed between the high resistance GaN layer 112 and the AlGaN barrier layer 115 in order to tune the conductivity of the 2DEG channel 114. The addition of the AlN layer 116 increases the conductivity of the 2DEG channel 114.

An optional GaN layer 117, having a thickness of about 1 to 4 nm, can be formed over AlGaN barrier layer 115. This optional GaN layer 117 protects AlGaN barrier layer 115 from oxidation in the process flow.

An optional dielectric layer 118, having a thickness in the range of about 5-200 nm, can be formed over AlGaN barrier layer 115, wherein this dielectric layer 118 serves as a passivation and/or anti-reflection layer. In one embodiment, optional dielectric layer 118 is silicon nitride. In other embodiments, optional dielectric layer 118 can include dielectric materials that are transparent in certain UV ranges (UV-A, UV-B, etc.), thereby providing UV filters for UV sensor 100. In accordance with one embodiment, dielectric layer 118 is formed in situ during the MOCVD process (i.e., in the same deposition chamber used to fabricate GaN stack 110 and AlGaN barrier layer 115). In an alternate embodiment, dielectric layer 118 is deposited ex situ (in an external tool during) device integration.

Electrically conductive contacts 121-122 are formed through the AlGaN barrier layer 115 (and also through the optional layers 116, 117 and 118, if present), wherein the contacts 121-122 provide electrical connections to 2DEG channel 114. Contacts 121 and 122 are referred to as source and drain contacts, respectively, herein. This is similar to the nomenclature used in a HEMT transistor, although no gate electrode exists in UV sensor 100.

In one embodiment, contacts 121-122 are metal structures, which can be formed by various processes. In a particular embodiment, contacts 121-122 are formed by etching openings that extend partially through AlGaN barrier layer 115. For example, if AlGaN barrier layer 115 has a thickness of 20 nm, then the openings are etched only about 10 nm into the AlGaN barrier layer 115. A metal stack is formed in the openings by sputtering a thin layer of titanium (Ti) in the openings, and then sputtering a layer of aluminum (Al) over the thin titanium layer. An optional titanium nitride (TiN) layer may be formed over the aluminum layer. The metal stack is patterned to remove any unnecessary portions (e.g., portions not required to form the contacts 121-122). During subsequent rapid thermal processing (RTP), the aluminum in the metal stacks supposedly diffuses to the underlying 2DEG channel 114 through the thin Ti layer, thereby establishing electrical contact to the 2DEG channel 114.

In the described embodiments, source contact 121 and drain contact 122 are separated by a distance in the range of about 10 to 3000 microns. Note that AlGaN barrier layer 115 is present in the space between source contact 121 and drain contact 122, and that no gate electrode is formed over AlGaN barrier layer 115, thereby simplifying fabrication of UV sensor 100. Source contact 121 and drain contact 122 can have various shapes, as described in more detail below.

Figure 2A:
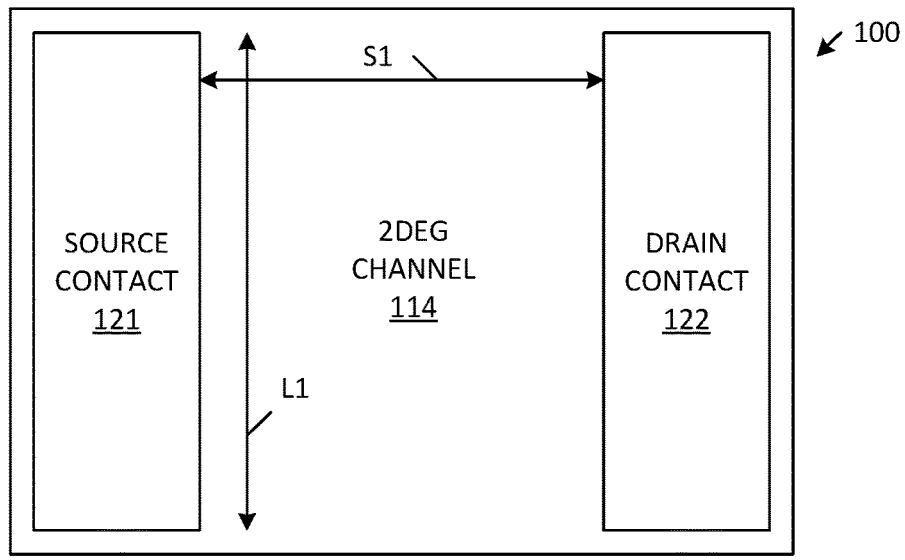
FIG. 2A is a top view of a UV sensor in accordance with one embodiment of the present invention, wherein source and drain contacts are both rectangular.

FIG. 2A is a top view of UV sensor 100 in accordance with one embodiment, wherein source and drain contacts 121-122 are both rectangular. The source and drain contacts 121-122 each have a length L1, and are separated by a spacing S. In one embodiment, L1=S1=50 microns. However, other dimensions can be used in other embodiments.

Figure 2B:
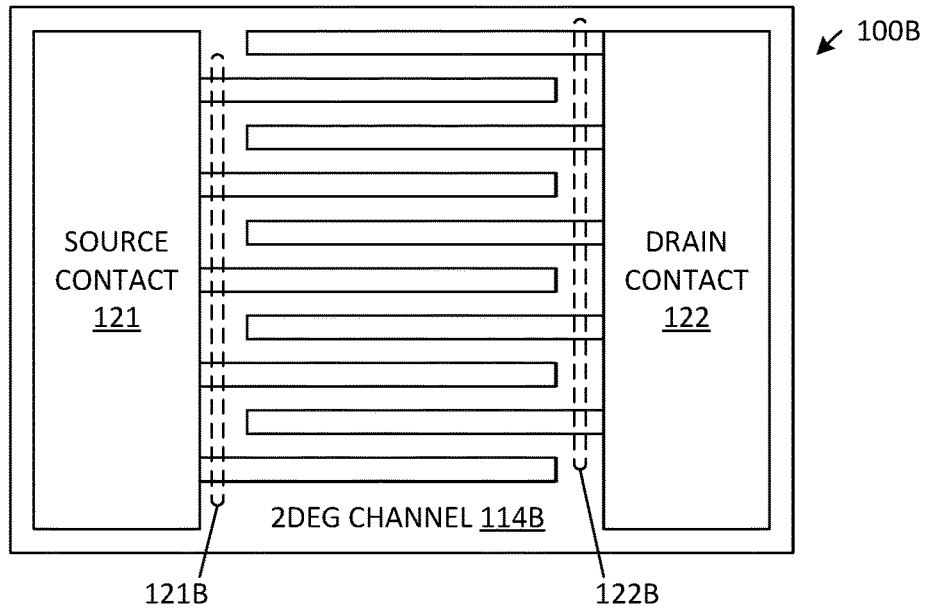
FIG. 2B is a top view of a UV sensor in accordance with an alternate embodiment of the present invention, wherein a set of source contact fingers extend from a source contact, and are interleaved with a set of drain contact fingers that extend from a drain contact.

FIG. 2B is a top view of a UV sensor 100B in accordance with an alternate embodiment, wherein a set of source contact fingers 121B extend from source contact 121 toward drain contact 122, and a set of drain contact fingers 122B extend from drain contact 122 toward source contact 121, wherein the source contact fingers 121B are interleaved with the drain contact fingers 122B. Note that 2DEG channel 114B exists between the interdigitated source and drain contact fingers 121B and 122B.

Figure 2C:
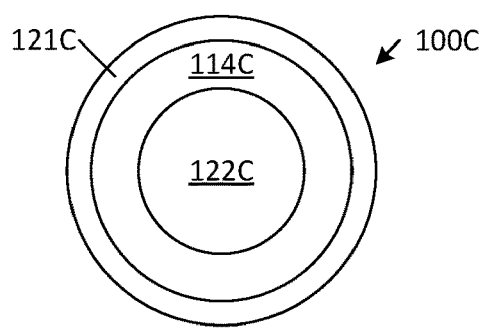
FIG. 2C is a top view of a UV sensor in accordance with another alternate embodiment of the present invention, which includes a circular drain contact and a surrounding annular source contact.

FIG. 2C is a top view of a UV sensor 100C in accordance with another alternate embodiment, which includes a circular drain contact 122C and an annular source contact 121C, wherein a 2DEG channel 114C has a doughnut shape between the drain contact 122C and the source contact 121C. Similar results can be obtained with the three UV sensors 100, 100B and 100C.

Returning to FIG. 1, a front side electrode 130 is formed to provide an electrical contact to the GaN stack 110. In the illustrated embodiment, the front side electrode 130 extends through the AlGaN barrier layer 115 (and any of the included optional layers 116-118) and through the high resistance GaN layer 112, such that the front side electrode 130 contacts the low resistance GaN layer 111. In one embodiment, the fabrication of front side electrode 130 includes forming device isolation by implantation with ions of an inert gas (e.g., Ar, N). In the illustrated embodiment, this implantation occurs in region 119 (using an implant mask), such that the AlGaN barrier layer 115 (and any of the included optional layers 116-118) in this region 119 become non-conductive, as illustrated by the shaded layers of FIG. 1. A mask defining the location of front side electrode 130 is formed over the resulting structure, and an etch is performed through this mask to form a deep opening that extends through the non-conductive material(s) and the high resistance GaN layer 112, thereby exposing the low resistance GaN layer 111. Front side electrode 130 is then created by depositing metal in the deep opening. Although front side electrode 130 is shown in the embodiment of FIG. 1, a back side electrode (shown below in FIG. 9) can alternately be used to contact low resistance GaN layer 111 in other embodiments.

The operation of UV sensor 100 will now be described. In general, UV sensor 100 is a 2DEG resistor which operates in the current sublinear or saturation mode. These modes are described in more detail below in connection with FIG. 3.

In the saturation mode, the drain current (Id) flowing in the 2DEG channel 114 saturates when the voltage applied across the source and drain contacts 121-122 is in the range of about 5-40 Volts (depending on the density of charges in the 2DEG channel 114). The saturation effect is more strongly pronounced in shorter devices (i.e., devices having a smaller spacing S). In the examples described below, the source contact 121 is held at 0 Volts, and a positive voltage is applied to the drain contact 122 during sensing operations. A series of experiments have demonstrated that current saturation is associated with the depletion of the 2DEG channel 114 close to the drain contact 122. This depletion is represented by the drain depletion region 125 in FIG. 1, which extends entirely through the high resistance GaN layer 112 to the low resistance GaN layer 111 under saturation conditions. There is a potential difference between the 2DEG channel 114 and the low resistance GaN layer 111 below the 2DEG channel 114. The voltage at the drain contact 122 drops at the GaN-2DEG channel 114 (reverse bias). The resistance between the drain contact 122 and the floating low resistance GaN layer 111 of the GaN stack 110 is much higher than the resistance between the source contact 121 and the floating low resistance GaN layer 111. Thus, even if the low resistance GaN layer 111 is floating, this low resistance GaN layer 111 is practically at zero potential (due to the source contact 121 being held at 0 Volts). In the lateral direction, the 2DEG channel 114 is depleted near the drain contact 122 (similar to what is happening in the pinch-off region of a MOS transistor). Thus, the applied source-to-drain voltage falls mainly in the drain depletion region 125.

This current saturation model was verified by applying the drain voltage (Vd) to the low resistance GaN layer 111 (i.e., electrically connecting drain contact 122 to front side contact 130). Under these conditions, no saturation was observed. More specifically, the drain current (Id) flowing to the drain contact 122 varied as a linear function of the voltage applied to the drain contact 122, up to tens of Volts.

Experimental results of UV sensing using UV sensor 100 are shown in FIGS. 3-7. As shown in FIG. 1, UV sensor 100 may be exposed to UV irradiation 150. Exposing UV sensor 100 to UV irradiation 150 has an effect equivalent to biasing the low-resistance GaN layer 111. That is, exposing UV sensor 100 to UV irradiation 150 results in a weaker current saturation effect.

Figure 3:
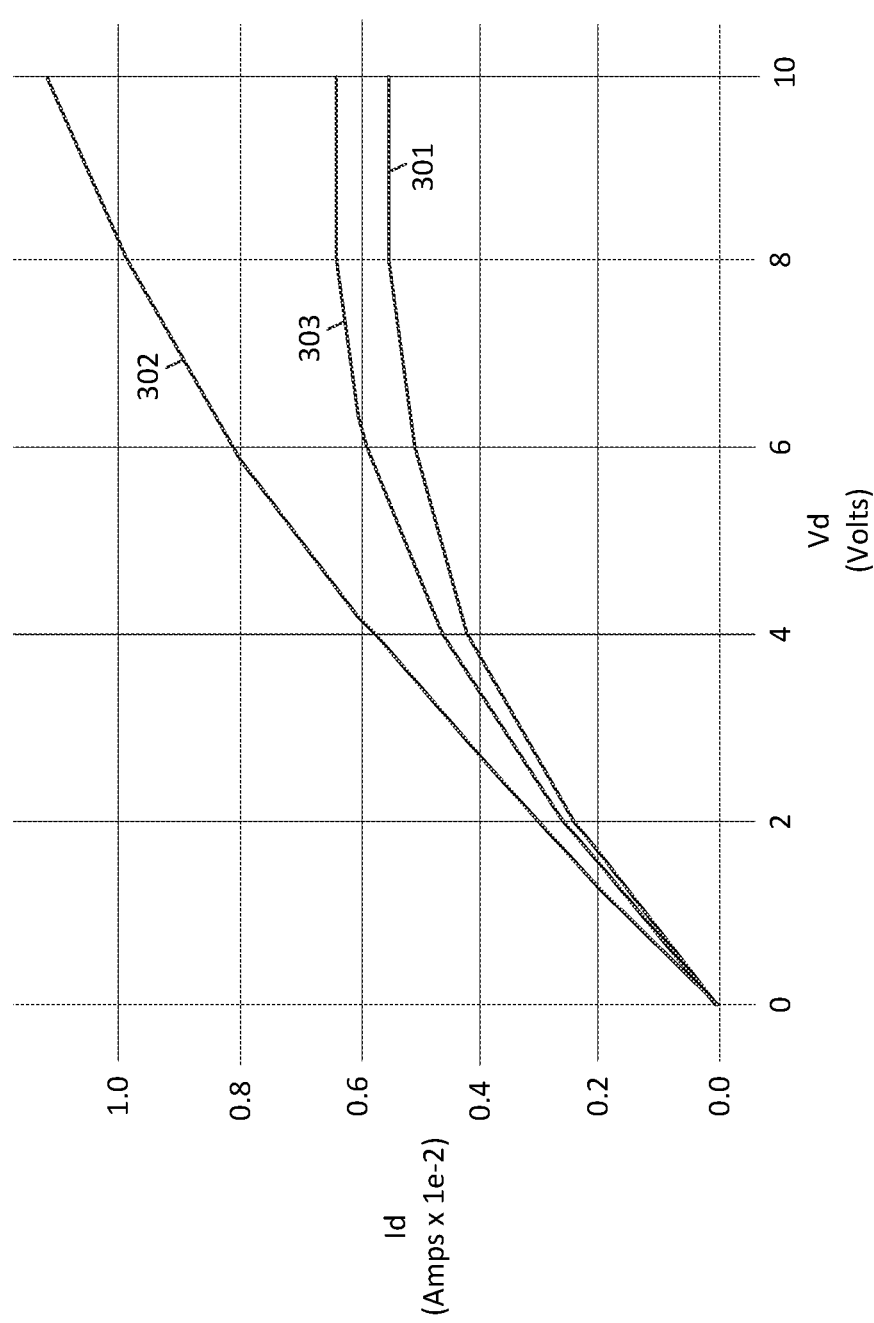
FIG. 3 is a graph illustrating the drain current of the UV sensor of FIG. 1 for various source-to-drain voltages and different UV exposure conditions.

FIG. 3 is a graph illustrating the drain current of UV sensor 100 for various source-to-drain voltages and different UV exposure conditions. The data presented in FIG. 3 corresponds with a UV sensor 100 having the configuration of FIG. 2A, wherein L1=S1=50 microns (i.e., a 50 um×50 um GaN resistor). Line 301 illustrates the initial response of UV sensor 100, prior to exposure to UV irradiation 150. When the source-to-drain voltage is low (e.g., when source contact 121 is held at 0 Volts and drain contact 122 (Vd) is in the range of about 1-2 Volts), and the front side electrode 130 is left floating, UV sensor 100 operates in a linear mode (i.e., the drain current Id increases linearly with respect to increases in the drain contact voltage Vd). Under these conditions, drain current Id flows through the 2DEG channel 214, and the drain depletion region 125 is insignificant. That is, the resistance of the depletion region 125 near drain contact 122 is small compared with the resistance of the 2DEG channel 114, such that the Id-Vd characteristic is close to linear. The potential of the low-resistance GaN layer 111 is close to Vss (0 Volts) in the linear mode.

As the voltage applied to drain contact 122 increases above 2 Volts, UV sensor 100 enters a saturation mode. More specifically, the drain depletion region 125 grows, such that the drain current Id does not significantly increase in response to increases in the source-to-drain voltage. As illustrated by line 301, the drain current Id reaches about 0.55×1e-2 Amps for an applied drain voltage of about 8-10 Volts. Under these conditions, the drain depletion region 125 extends all the way through high resistance GaN layer 112 to low resistance GaN layer 111. This drain depletion region 125 limits the drain current Id through the 2DEG channel 114. Under these saturation conditions, the low resistance GaN layer 111 is held at the source contact voltage (0 Volts), such that the entire drain voltage (8-10 Volts) drops across the drain depletion region 125.

Line 302 of FIG. 3 illustrates the response of UV sensor 100 when exposed to UV irradiation 150 with a mercury UV lamp. Again, the source-to-drain voltage is increased, (e.g., when source contact 121 is held at 0 Volts and the voltage of drain contact 122 is increased from 0 Volts to 10 Volts), while the front side electrode 130 is left floating.

With exposure to UV irradiation 150, UV photons are absorbed in the GaN stack 110. As a result, a high initial photocurrent is introduced to the reverse biased region (i.e., drain depletion region 125) under drain contact 122. That is, the UV irradiation 150 effectively reduces the depth of the drain depletion region 125 under drain contact 122, such that this drain depletion region 125 does not extend all the way through the high-resistance GaN layer 112. The high photocurrent under drain contact 122 results in charging the floating low resistance GaN layer 111, so that the potential of this layer 111 under the drain contact 122 is close to the drain contact voltage Vd (in this case there is a balance of photocurrent under the source and drain contacts 121-122, and a small voltage drop, much lower than the applied drain contact voltage Vd, across the GaN stack 110 in the vertical direction). With the low resistance GaN layer 111 held at the drain contact voltage Vd, there is no saturation of the 2DEG channel 114. Rather, under these conditions, the drain current Id increases in a substantially linear manner in response to increases in the drain contact voltage Vd. As illustrated by line 302, the drain current Id reaches about 1.1×1e-2 Amps for an applied drain contact voltage of 10 Volts.

After several cycles of switching the UV source 150 on and off, the current response of UV sensor 100 is illustrated by line 303 when the UV source 150 is turned off. Again, UV sensor 100 operates in a saturation mode at high source-to-drain voltages. In the illustrated example, the drain current Id of about 0.66×1e-2 Amps exists for applied drain voltages in the range of about 8-10 Volts. The difference between lines 301 and 303 can be attributed to the PPC effect.

The current response of UV sensor 100 is therefore on the order of about 6 mA. With this current response, UV sensor 100 can advantageously be employed in electrical circuits, without requiring separate current amplifiers. The calculated responsivity of UV sensor 100 is of the order $10^8$ A/W, which significantly exceeds the reported responsivity in the known literature (e.g., the responsivity of the gated HEMT structures described by Zaidi).

Figure 4:
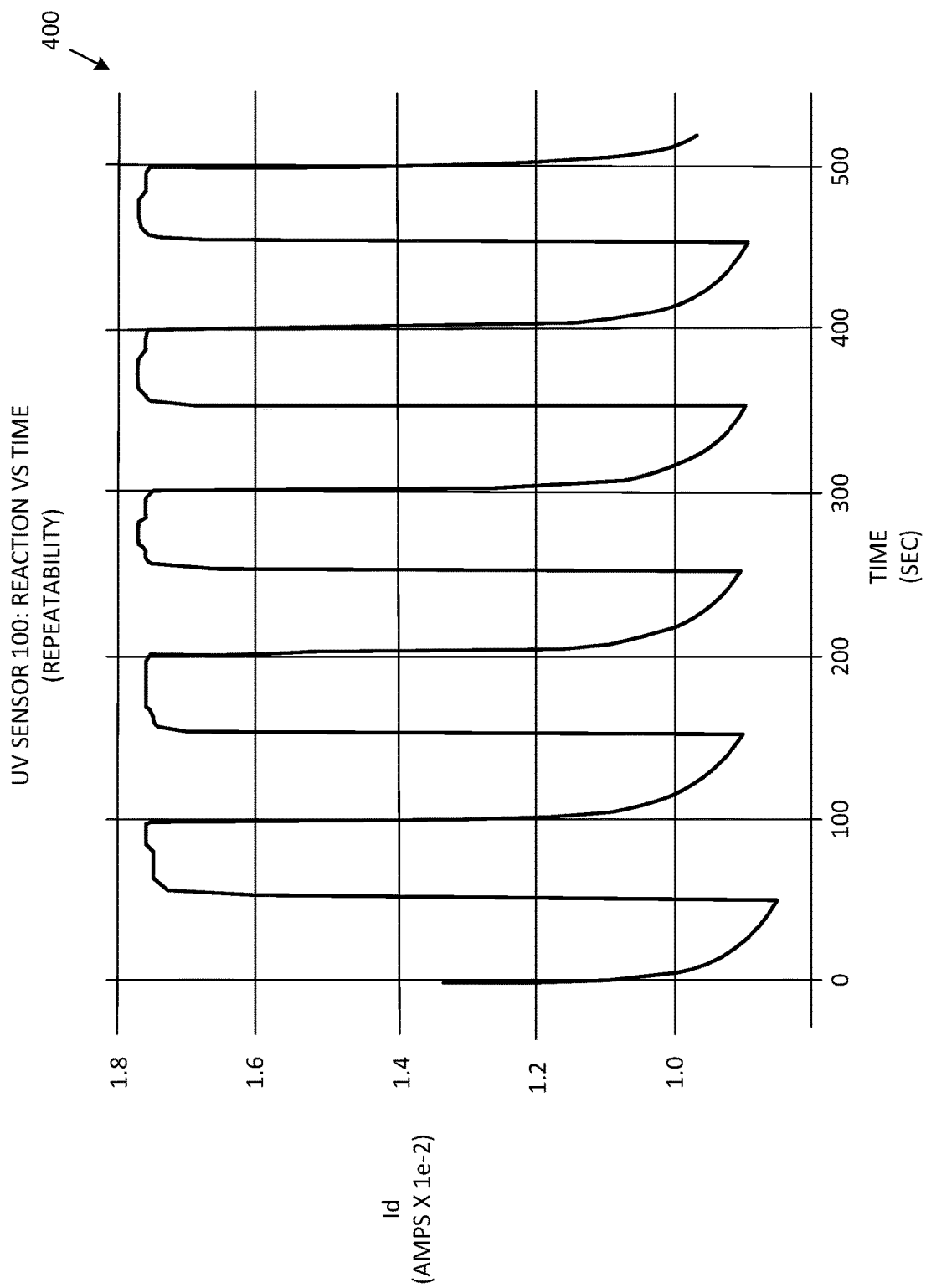
FIG. 4 is a graph illustrating a series of repeated UV measurements using the UV sensor of FIG. 1, without refresh operations.

FIG. 4 is a graph 400 illustrating a series of repeated UV measurements using UV sensor 100, without refresh operations. As illustrated by graph 400, when UV sensor 100 is exposed to UV irradiation 150 (and a high voltage of about 20 Volts is applied across the source and drain contacts 121-122), a drain current (Id) of about 1.75×1e-2 Amps flows through the UV sensor 100. When UV sensor 100 is not exposed to UV irradiation 150 (and a high voltage is applied across the source and drain contacts 121-122), a drain current of about 0.9×1e-2 Amps flows through the UV sensor 100. As illustrated by graph 400, the persistent photoconductivity decay time of UV sensor 100 is of the order of 20 seconds (i.e., it takes about 20 seconds for the drain current Id to drop from a value of about 1.75×1e-2 Amps to a value of about 1.00×1e-2 after the UV irradiation 150 is removed). Nevertheless, initial rising and decreasing regions of the curve show relaxation times much less than several seconds required for the drain current (Id) to drop more than 30% when the source of UV irradiation 150 is switched off, and then less than one second for the drain current (Id) to increase back to the initial value when the UV irradiation 150 is switched on, thus showing that the use of UV sensor 100 is practical (for implementing repeated UV sensing operations) even without a separate refresh operation.

Figure 5:
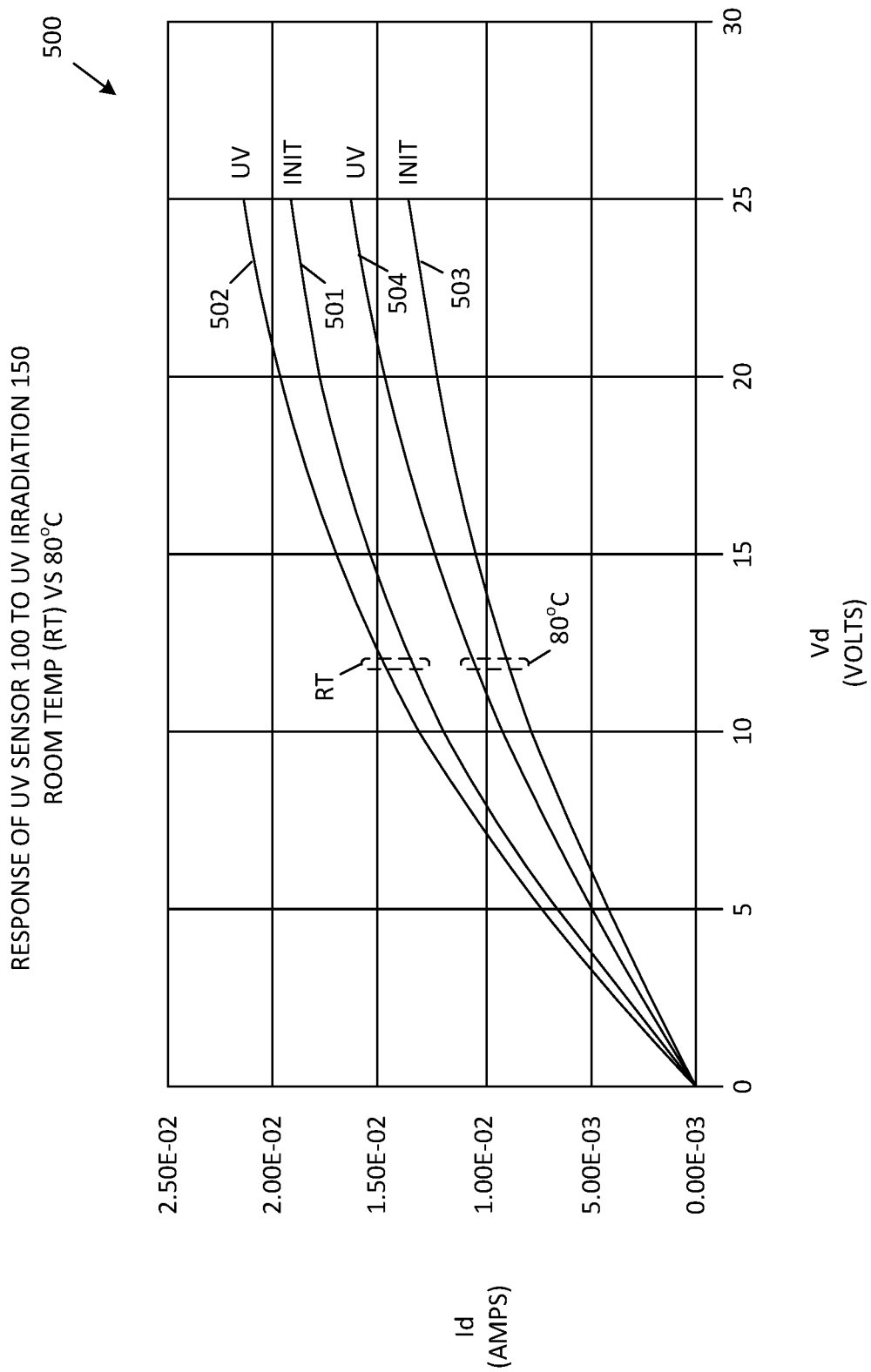
FIG. 5 is a graph illustrating the response of the UV sensor of FIG. 1 to UV irradiation at room temperature and at an elevated temperature of 80° C.

FIG. 5 is a graph 500 illustrating the response of UV sensor 100 to UV irradiation at room temperature and at 80° C. More specifically, line 501 shows drain current Id versus drain contact voltage Vd (source contact voltage=0 Volts) at room temperature without UV irradiation 150. Line 502 shows drain current Id versus drain contact voltage Vd (source contact voltage=0 Volts) at room temperature with UV irradiation 150.

Line 503 shows drain current Id versus drain contact voltage Vd (source contact voltage=0 Volts) at 80° C. without UV irradiation 150. Line 502 shows drain current Id versus drain contact voltage Vd (source contact voltage=0 Volts) at 80° C. with UV irradiation 150. In the example of FIG. 5, UV sensor 100 was cycled several times without refresh. The values of drain current at 80° C. are lower than the values of drain current at room temperature, consistent with mobility decrease of electrons in 2DEG channel 114 at higher temperatures. However, responsivity to UV irradiation 150 is of the same order of magnitude at room temperature and at 80° C. That is, the vertical difference between lines 501 and 502 (i.e., difference in drain current Id) is almost the same as the vertical difference between lines 503 and 504 (i.e., difference in drain current Id) for any particular drain contact voltage Vd. Thus, UV sensor 100 is advantageously able to maintain sensitivity at elevated temperatures.

Figure 6:
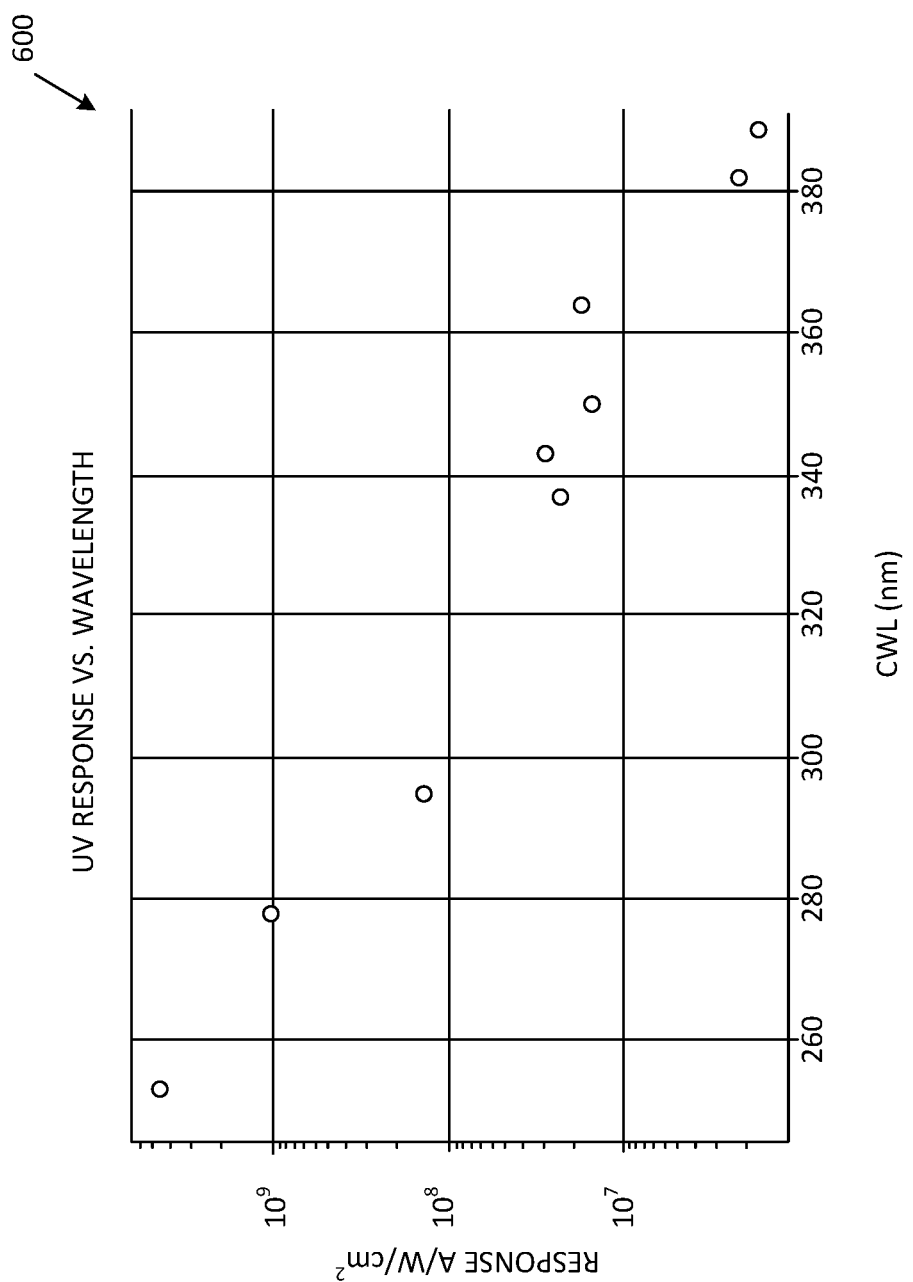
FIG. 6 is a graph illustrating the spectral sensitivity of the UV sensor of FIG. 1 in the 'solar blind' spectral range.

FIG. 6 is a graph 600 illustrating the spectral sensitivity of UV sensor 100 in the 'solar blind' spectral range, in accordance with one embodiment. In this embodiment, there are about four orders of magnitude difference in response to UV irradiation between 255 nm and 360 nm wavelengths.

Figure 7:
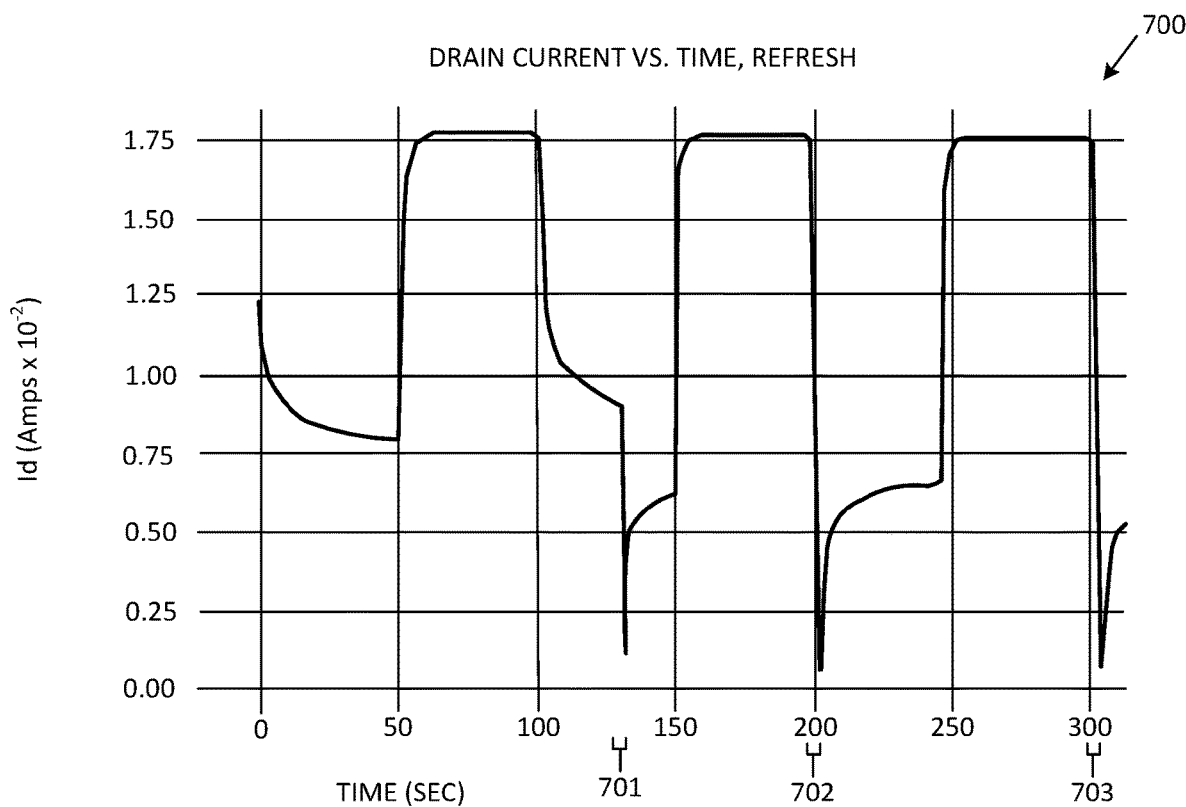
FIG. 7 is a graph illustrating the influence of electrical refresh operations on the UV sensor of FIG. 1, in accordance with one embodiment of the present invention.

FIG. 7 is a graph 700 illustrating the influence of electrical refresh operations on UV sensor 100, in accordance with one embodiment. Note that after exposure to UV irradiation 150, some of the generated holes are trapped in the GaN stack 110 (or excited electrons leave immobile positive ions after trap excitation by the UV quanta). The trapped positive charge enhances the conductivity of the 2DEG channel 114. Thus, the conductivity of UV sensor 100 is higher after exposure to UV irradiation 150 (consistent with PPC models). In accordance with one embodiment, the trapped positive charges are discharged using an electrical refresh operation. This electrical refresh operation can be performed by disconnecting the source contact 121 of the UV sensor 100, connecting the drain contact 122 to ground (0 Volts), and applying a high voltage of about 20-25 Volts to the front side electrode 130 (and therefore the low resistance GaN layer 111) for several seconds. Under these conditions, holes trapped in the GaN stack 110 (which lead to PPC) are discharged by the electric field (to the drain contact 122). In an alternate embodiment, an electrical refresh can be performed by applying a high voltage to the drain contact 122 (while grounding the front side electrode 130), although this alternate electrical refresh method is less efficient. Refresh operations were performed at time points 701, 702 and 703 as shown in graph 700. In one embodiment, a refresh operation can be completed in about 3 seconds. After a refresh operation is complete, the trapped positive charge is removed from the GaN stack 110, thereby advantageously eliminating PPC effects.

Figure 8:
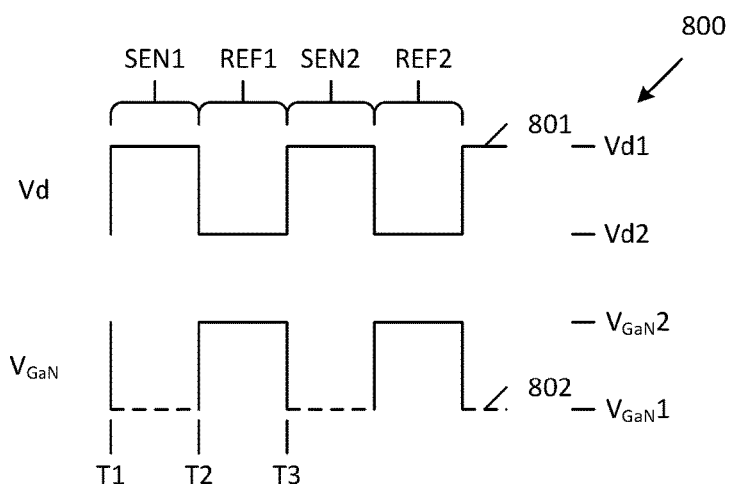
FIG. 8 is a waveform diagram illustrating voltages applied to the drain contact and the low resistance GaN layer of the UV sensor of FIG. 1 to alternately perform refresh operations and sensing operations in accordance with one embodiment of the present invention.

FIG. 8 is a waveform diagram 800 illustrating voltages applied to the drain contact 122 and the low resistance GaN layer 111 to alternately perform refresh operations (e.g., REF1 and REF2) and sensing operations (e.g., SEN1 and SEN2) in accordance with one embodiment of the present invention. The voltage (Vd) applied to drain contact 122 is shown as waveform 801, which has a high voltage (Vd1) during the sensing operations (SEN1 and SEN2) and a low voltage (Vd2) during the refresh operations (REF1 and REF2). The voltages applied to low resistance GaN layer 111 ($V_{GaN}$) are shown as waveform 802, which has a low voltage ($V_{GaN}1$) during the sensing operations (SEN1 and SEN2) and a high voltage ($V_{GaN}2$) during the refresh operations (REF1 and REF2). As described above, the voltage $V_{GaN}1$ is the voltage induced on low resistance GaN layer 111 when this layer 111 is allowed to float. As illustrated by FIG. 8, the waveform 801 includes a plurality of pulses having a first phase (high during sensing operations and low during refresh operations), while the waveform 802 includes a plurality of pulses having a second phase, opposite to the first phase (low during sensing operations and high during refresh operations). In one embodiment, the pulses of the waveforms 801 and 802 each have an amplitude in the range of about 10 Volts to 50 Volts. For example, waveform 801 may include transition between a low voltage Vd2 of 0 Volts and a high voltage Vd1 of 10 to 50 Volts, while waveform 802 may include transition between a low voltage $V_{GaN}1$ of 0 Volts and a high voltage $V_{GaN}2$ of 10 to 50 Volts. In one embodiment, waveforms 801 and 802 each includes rectangular pulses having a duration in the range of about 1 microsecond to 1 second (e.g., (T2–T1)=(T3–T2)=1 microsecond to 1 second).

As described above, electrical refresh operations can be used to discharge positive charge trapped in GaN stack 110 after exposure to UV irradiation. In an alternate embodiment, this trapped positive charge can be discharged by heating (or a combination of heating and electrical refresh). In this case, heating must be performed rapidly. In one embodiment, the UV sensor is fabricated on a membrane with a low thermal mass, allowing the UV sensor to be heated with a relatively low-power heater in a relatively fast manner.

Figure 9:
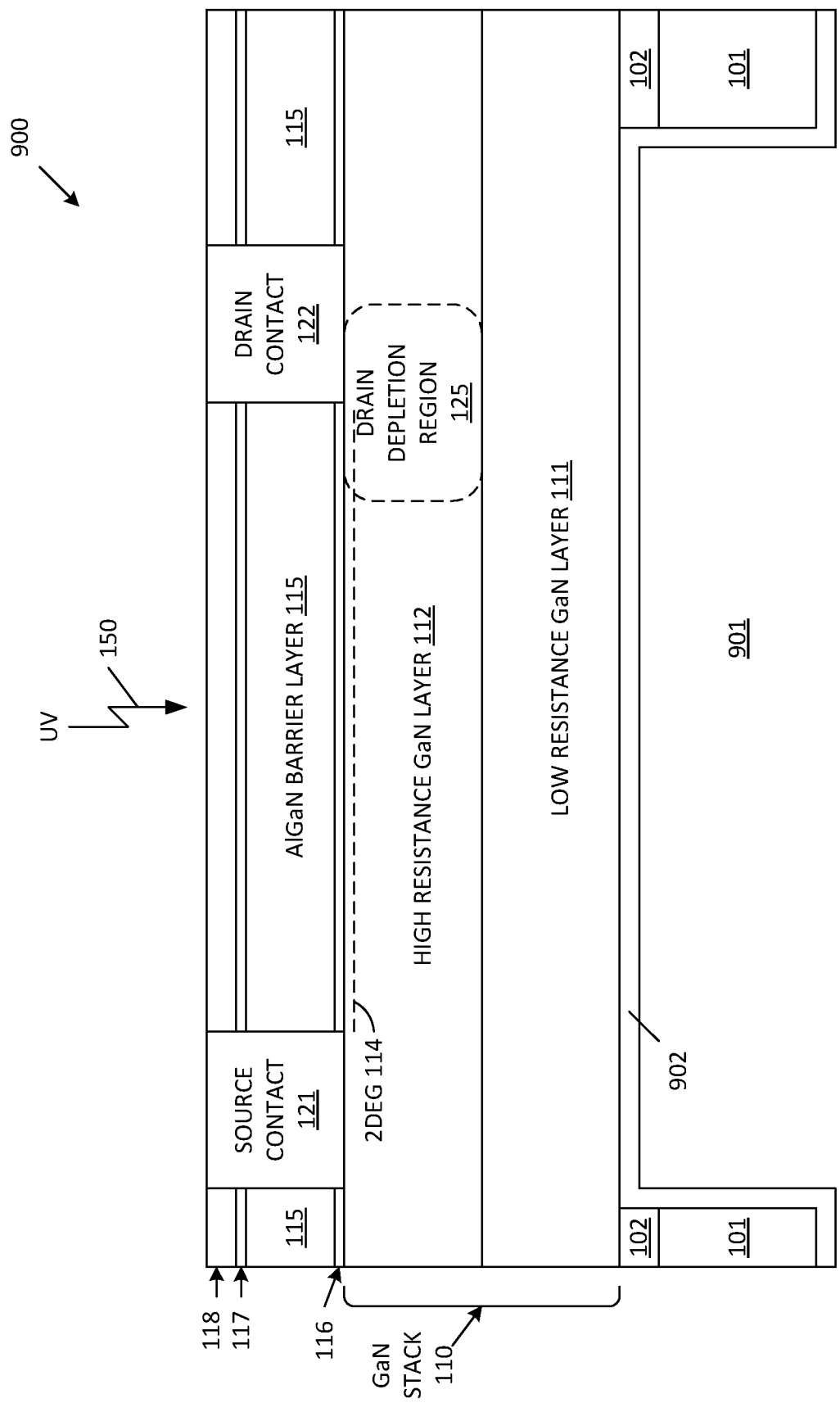
FIG. 9 is a cross sectional view of a UV sensor fabricated on a membrane having a low thermal mass in accordance with one embodiment of the present invention.

FIG. 9 is a cross sectional view of UV sensor 900 fabricated on a membrane having a low thermal mass in accordance with one embodiment of the present invention. Because UV sensor 900 is similar to UV sensor 100, similar elements in FIGS. 1 and 9 are labeled with similar reference numbers. Notably, UV sensor 900 does not include the front side electrode 130 of UV sensor 100. To form a membrane having a low thermal mass, a cavity 901 is etched from the back side of the substrate 101, using the AlN nucleation layer 102 as an etch stop. The cavity 901 is then extended by removing the exposed portions of the AlN layer 102, thereby providing access to the lower surface of low-resistance GaN layer 111. In one embodiment, the cavity 901 is formed under the space between the source and drain contacts 121-122. Note that the cavity 901 may extend well beyond the space between the source and drain contacts 121-122. In this manner, the portions of UV sensor 900 located above the cavity 901 form a membrane having a low thermal mass.

An electrical contact 902 to the low-resistance GaN layer 111 is formed by depositing a metal structure (e.g., Ti/TiN/Al stack) on the back side of the substrate 101, as illustrated. Note that electrical contact 902 replaces the front side metal contact 130 of UV sensor 100. In an alternate embodiment, the backside electrical contact 902 is not formed, and a front side metal contact (similar to front side metal contact 130) is used to contact the low resistance GaN layer 111 of UV sensor 900. In this embodiment, the front side metal contact is formed outside of the membrane area defined by the cavity 901.

Figure 10:
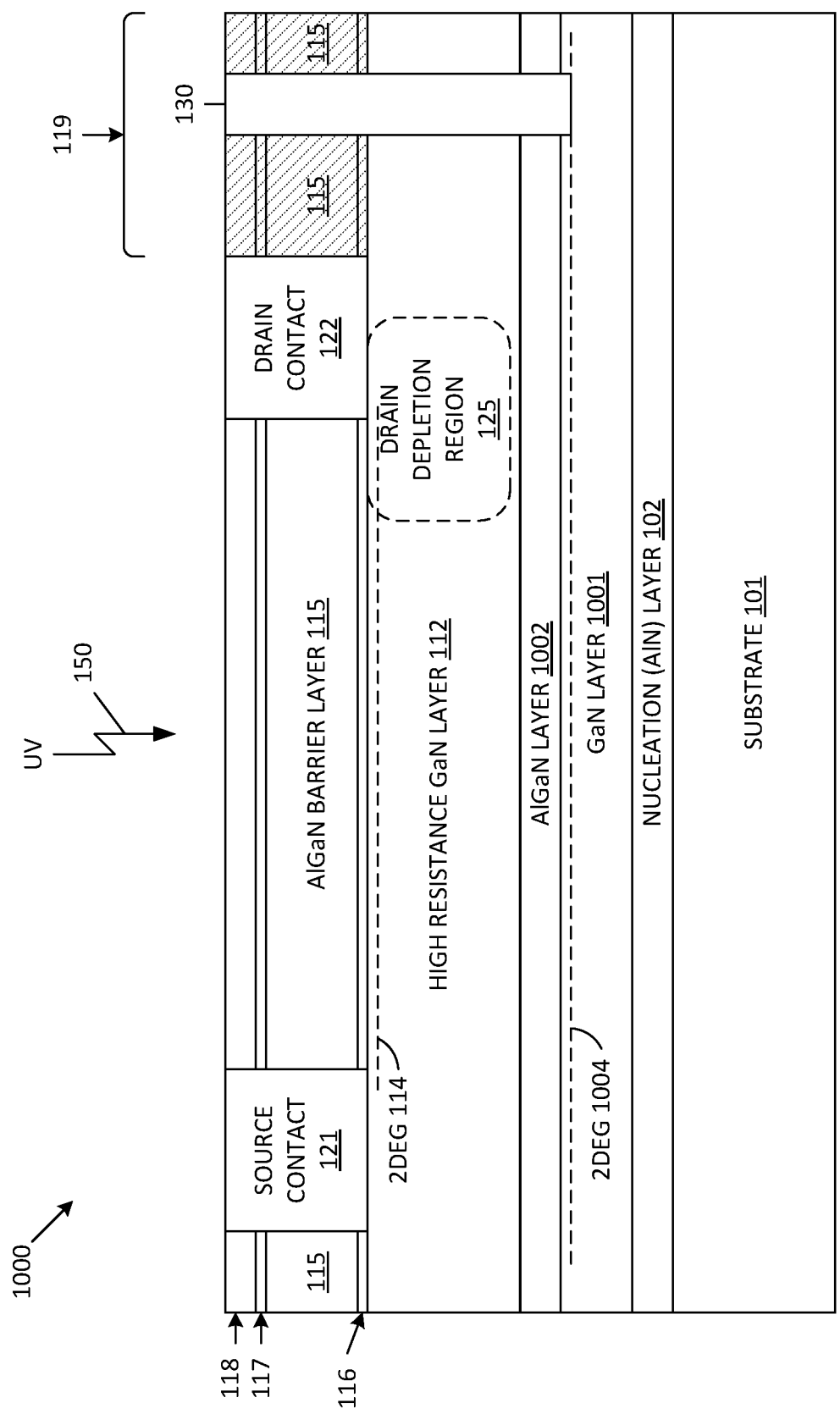
FIG. 10 is a cross sectional view of a UV sensor that includes two 2DEG conductive channels in accordance with another embodiment of the present invention.

FIG. 10 is a cross sectional view of UV sensor 1000 in accordance with another embodiment of the present invention. Because UV sensor 1000 is similar to UV sensor 100, similar elements are labeled with similar reference numbers in FIGS. 1 and 10. In UV sensor 1000, the low-resistance GaN layer 111 of UV sensor 100 is eliminated (and is effectively replaced by a second 2DEG channel 1004 formed under the high-resistance GaN layer 112, between GaN layer 1001 and AlGaN layer 1002. In one embodiment, UV sensor 1000 is fabricated in a similar manner as UV sensor 100, with the following exceptions. GaN buffer layer 1001 is fabricated on nucleation layer 102, and AlGaN layer 1002 is fabricated on GaN buffer layer 1001, thereby creating the second 2DEG conductive channel 1004 at the upper surface of GaN buffer layer 1001. High resistance GaN layer 112 is then fabricated on AlGaN layer 1002. In the embodiment illustrated by FIG. 10, the front side contact 130 is extended to contact the second 2DEG channel 1004. UV sensor 1000 operates in the same manner as UV sensor 100.

In an alternate embodiment, a membrane having a low thermal mass can be formed by forming a cavity (similar to cavity 901) through substrate 101 and nucleation layer 102, (at locations between the source and drain contacts 121-122).

In accordance with another embodiment, a heater element can be added to the above-described UV sensors. The heater element is used to heat the UV sensor between sensing operations, thereby eliminating the PPC effects in the UV sensor.

Figure 11:
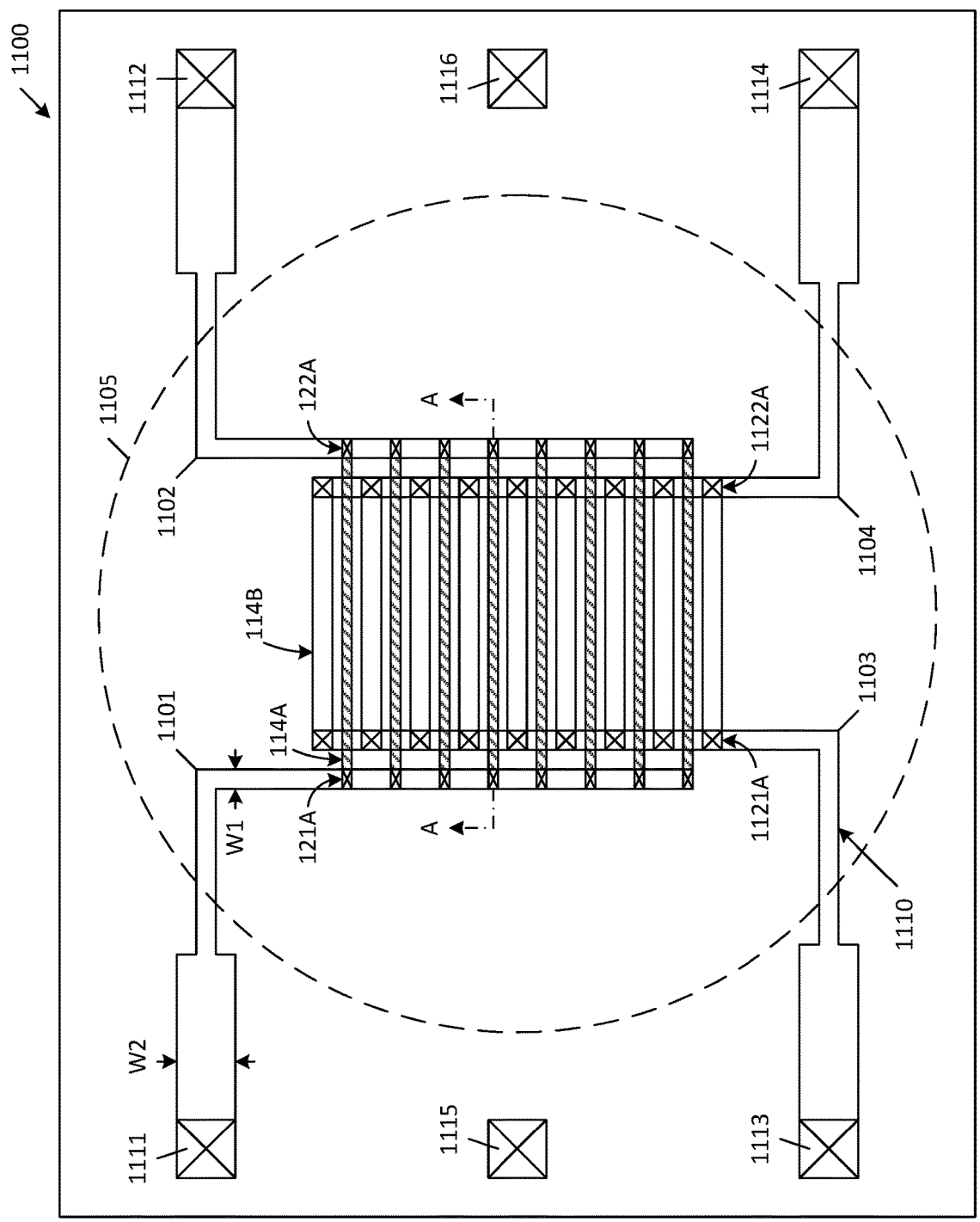
FIG. 11 is a top view of a UV sensor that includes a 2DEG resistor/heater element in accordance with another embodiment of the present invention.

FIG. 11 is a top view of a UV sensor 1100 that includes a heater element 1110 in accordance with one embodiment of the present invention. UV sensor 1100 includes a plurality of parallel 2DEG sensor channels 114A (each represented by a shaded rectangle in FIG. 11), a plurality of corresponding source contacts 121A (shown as a first column of rectangles, each containing an 'x') and a plurality of corresponding drain contacts 122A (shown as a second column of rectangles, each containing an 'x'). In various embodiments, the cross sectional view along section line A-A of FIG. 11 corresponds with the cross sectional views of UV sensors 100, 900 and/or 1000 described above in connection with FIGS. 1, 9 and/or 10. The plurality of source contacts 121A are commonly connected to a source metal trace 1101, and the plurality of drain contacts 122A are commonly connected to a drain metal trace 1102.

UV sensor 1100 also includes a plurality of parallel 2DEG resistor channels 114B (each represented by an unshaded rectangle in FIG. 11), a first plurality of corresponding resistor contacts 1121A (shown as a first column of squares, each containing an 'x') and a second plurality of corresponding resistor contacts 1122A (shown as a second column of squares, each containing an 'x'). The 2DEG sensor channels 114A are interleaved with the 2DEG resistor channels 114B. In one embodiment, the 2DEG sensor channels 114A and 2DEG resistor channels 114B are formed from a single 2DEG channel (e.g., 2DEG sensor channel 114), by performing a patterned isolating implant, which destroys portions of the single 2DEG channel outside of the regions specified by 2DEG sensor channels 114A and 2DEG resistor channels 114B.

In one embodiment, the 2DEG resistor channels 114B and corresponding resistor contacts 1121A and 1122A have the same construction as the 2DEG sensor channels 114A and corresponding source and drain contacts 121A and 122A.

The first plurality of resistor contacts 1121A are commonly connected to a first metal trace 1103, and the second plurality of resistor contacts 1122A are commonly connected to a second metal trace 1104.

In the embodiment illustrated by FIG. 11, the 2DEG sensor channels 114A and the 2DEG resistor channels 114B are located on a thin membrane defined by a cavity 1105 formed in the backside of the UV sensor 1100. Note that cavity 1105 is similar to cavity 901 described above in connection with the UV sensor 900 of FIG. 9. Cavity 1105 advantageously reduces the thermal mass of the UV sensor 1100, thereby allowing heat generated (by passing current through the 2DEG resistor channels 114B) to more effectively refresh the UV sensor 1100 (i.e., eliminate PPC issues). Although cavity 1105 is illustrated as a circle in FIG. 11, it is understood that cavity 1105 can have other shapes. It is also understood that cavity 1105 can be eliminated in other embodiments.

To ensure a high voltage drop (and therefore high heat generation) on the portions of the traces located over the cavity 1105, each of the metal traces 1101-1104 has a first (relatively small) width W1 (and therefore a relatively high resistance) over the cavity 1105, and a second (relatively large) width W2 (and therefore a relatively small resistance) outside the boundary of the cavity 1105.

Contacts 1111, 1112, 1113 and 1114 allow the required operating voltages to be applied to metal traces 1101, 1102, 1103 and 1104, respectively. Contacts 1115-1116 provide electrical connections to low resistance GaN layer 111 when UV sensor 1100 implements the same general structure as UV sensors 100 or 900 (FIG. 1 and FIG. 9). Similarly, contacts 1115-1116 provide electrical connections to the second 2DEG channel 1004 when UV sensor 1100 implements the same general structure as UV sensor 1000 (FIG. 10).

UV sensor 1100 implements sensing operations in the manner described above. That is, a source voltage of 0 Volts is applied to source contact 1111, a high drain voltage is applied to drain contact 1112, and the contacts 1115-1116 are left floating. The contacts 1113-1114 to the heater resistor are also left floating (i.e., the heater is disconnected) during the sensing operations.

UV sensor 1100 also implements thermal refresh operations in the following manner. Resistor contact 1113 is grounded and a high positive voltage (e.g., 5 to 50 Volts) is applied to resistor contact 1114 and also to contacts 1115-1116. Applying the same high voltage to resistor contact 1114 and contacts 1115-1116 eliminates current saturation effects in the 2DEG resistor channels 114B (because the underlying low resistance GaN layer 111 or the second 2DEG channel 1004 is biased at the same high voltage as the 2DEG resistor channels 114B). As a result, currents forced through the 2DEG resistor channels 114B can be high enough to generate the heat necessary to eliminate excess holes from the adjacent 2DEG sensor channels 114A.

In one embodiment, UV sensor 1100 may implement electrical refresh at the same time as the thermal refresh. As described above, electrical refresh is implemented by disconnecting the source contact 1111, connecting the drain contact 1112 ground, and applying a high voltage to contacts 1115-1116 (which is already a condition necessary for the heater operation during the thermal refresh).

Although the 2DEG resistor channels 114B are arranged in parallel in UV sensor 1100, it is understood that other 2DEG resistor channels, having different shapes or locations, can be used to implement a heater in other embodiments. For example, 2DEG resistor channels 114B can be replaced with a serpentine or spiral 2DEG resistor channel formed on the membrane defined by cavity 1105.

Figure 12:
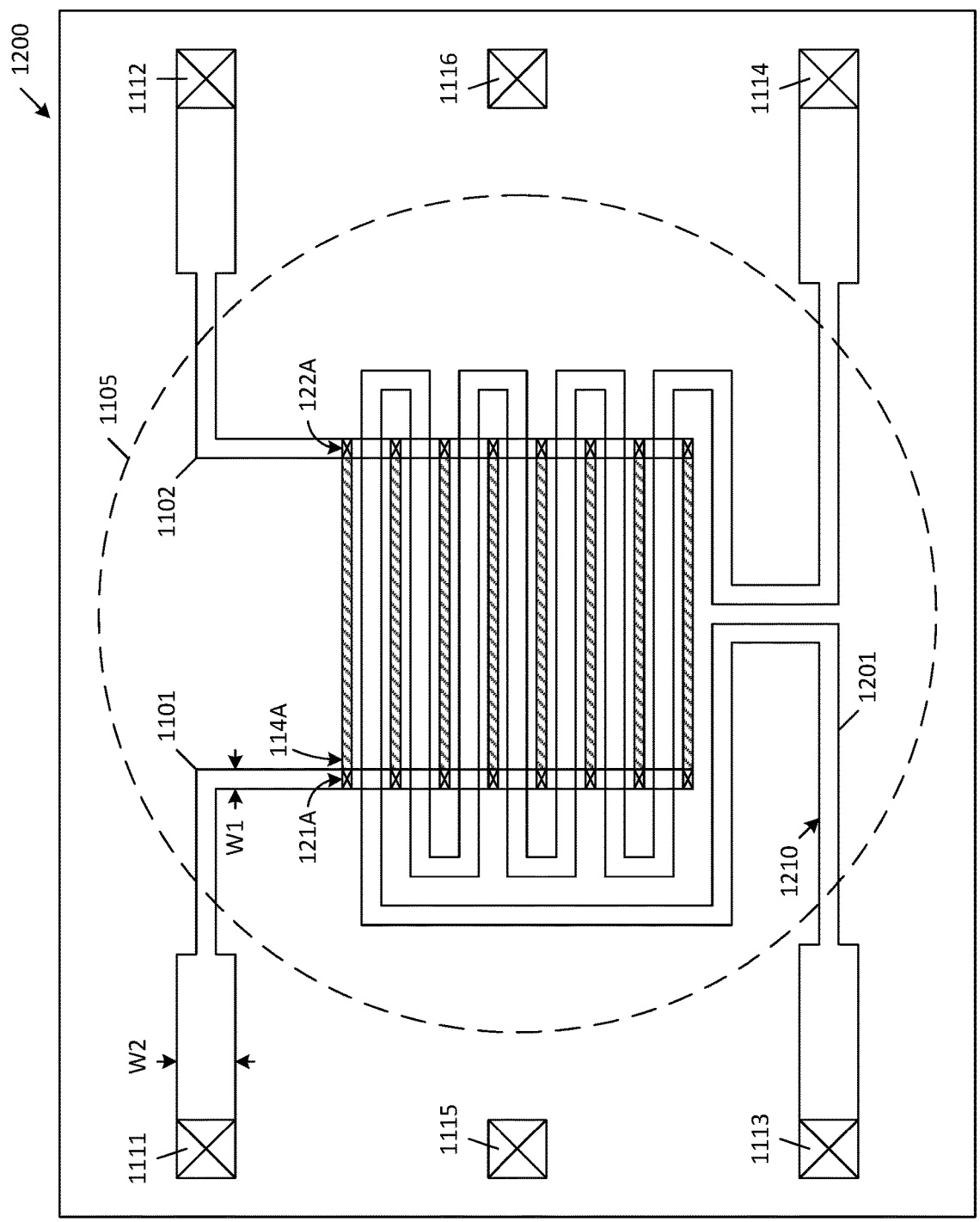
FIG. 12 is a top view of a UV sensor that includes a metal/polysilicon heater element in accordance with another embodiment of the present invention.

FIG. 12 is a top view of a UV sensor 1200 that includes a heater element 1210 in accordance with an alternate embodiment of the present invention. Because UV sensor 1200 is similar to UV sensor 1100, similar elements in FIGS. 11 and 12 are labeled with similar reference numbers. The heater element 1210 includes a polysilicon or metal trace 1201, which is formed over the upper surface of UV sensor 1200 (e.g., over silicon nitride layer 118). In one embodiment, trace 1201 is formed from the same material used to form contacts 121A-122A. In another embodiment, trace 1201 is formed from an additional layer, which is patterned during a separate photolithography step. Trace 1201 has a serpentine shape, which extends between 2DEG sensor channels 114A, as illustrated. Note that in this embodiment, trace 1201 must be formed in a different layer than the conductive traces 1101 and 1102. In an alternate embodiment, trace 1201 surrounds (but does not extend between) 2DEG sensor channels 114A. Contacts 1113 and 1114 provide electrical connections to each end of the trace 1201.

Heater element 1210 operates in a manner similar to heater element 1110. Thus, during refresh operations, a high current is forced through trace 1201 (e.g., by grounding contact 1113 and applying a high voltage to contact 1114), thereby heating the UV sensor 1200. This heat is high enough to eliminate excess holes from the 2DEG sensor channels 114A.

Advantages of UV sensors 100, 900 and 1000 include the ability to tune the UV absorption spectrum by changing the band diagram of the AlGaN barrier layer 115 (by changing Al content of the AlGaN barrier layer 115, the bandgap of AlGaN can be tuned between 3.4 eV for GaN and 6 eV for AlN), changing the thickness of the GaN stack 110, and using SiN films on top of the AlGaN barrier layer. In addition, UV sensors 100 and 900 are 'visible blind' (i.e., are not effected by visible light), and therefore can be used for UV testing without requiring additional filters. By using a proper SiN and AlGaN films the UV sensors can be made also "solar-blind" and used in systems where absence of sensitivity to the background solar radiation is critical (e.g., UV communications, night vision in UV, etc.)

Moreover, UV sensors of the present invention can be readily integrated into conventional fabrication processes because of the simple construction of these UV sensors (which is essentially a resistor with source and drain contacts and no gates required), and due to the use of fab friendly materials in the fabrication process.

In addition, UV sensors of the present invention can be easily refreshed to compensate for persistent photoconductivity effects.

In addition, the use of the low resistance GaN layer 111 in the GaN stack 110 advantageously provides high sensitivity, allows electrical refresh to suppress PPC, and allows operation in a regime when there is a depleted drain region 125 (and no 2DEG channel) near the drain contact 122.

In addition, the UV sensors of the present invention advantageously do not require a HEMT structure, because these UV sensors do not require gates.

In addition, the UV sensors of the present invention can advantageously be fabricated on an inexpensive silicon substrate 101.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. An ultraviolet (UV) light sensor comprising:
   a gallium nitride (GaN) stack including a lower GaN layer formed over a nucleation layer, and an upper GaN layer formed over the lower GaN layer, wherein the lower GaN layer has a lower resistivity than the upper GaN layer, and wherein a two-dimensional electron gas (2DEG) conductive channel exists at an upper surface of the upper GaN layer;
   an aluminum gallium nitride (AlGaN) layer formed over the upper surface of the upper GaN layer;
   a source contact that extends through the AlGaN layer and contacts the upper surface of the upper GaN layer, whereby the source contact is electrically coupled to the 2DEG conductive channel;
   a drain contact that extends through the AlGaN layer and contacts the upper surface of the upper GaN layer, whereby the drain contact is electrically coupled to the 2DEG conductive channel; and
   a drain depletion region that extends from the upper surface of the upper GaN layer to the lower GaN layer under the drain contact, wherein an electrical current between the source contact and the drain contact is a function of UV light received by the GaN stack.

2. The UV light sensor of claim 1, wherein the nucleation layer is formed over a silicon substrate.

3. The UV light sensor of claim 1, further comprising a third GaN layer having a thickness of 1 nm to 3 nm formed over the AlGaN layer.

4. The UV light sensor of claim 1, further comprising a dielectric layer having a thickness of 5 nm to 200 nm formed over the AlGaN layer.

5. The UV light sensor of claim 4, wherein the dielectric layer comprises silicon nitride.

6. The UV light sensor of claim 1, further comprising an AlN layer having a thickness of 1 nm to 2 nm formed between the AlGaN layer and the upper GaN layer.

7. The UV light sensor of claim 1, wherein the GaN stack has a thickness in the range 0.5 um to 6 um.

8. The UV light sensor of claim 1, wherein the lower GaN layer is an unintentionally doped n-type layer.

9. The UV light sensor of claim 8, wherein the lower GaN layer is doped with silicon.

10. The UV light sensor of claim 1, wherein the source contact and the drain contact are separated by 1 um to 3000 um.

11. The UV light sensor of claim 1, wherein the AlGaN layer has a doughnut shape between the source contact and the drain contact.

12. The UV light sensor of claim 1, wherein the source contact and the drain contact comprise interdigitated structures.

13. The UV light sensor of claim 1, wherein the nucleation layer is formed over a substrate, the UV light sensor further comprising a cavity formed through the substrate to the lower GaN layer.

14. The UV light sensor of claim 13, further comprising a heater formed over the cavity.

15. The UV light sensor of claim 14, wherein the heater comprises a 2DEG resistor formed in the upper GaN layer.

16. The UV light sensor of claim 15, wherein the lower GaN layer is coupled to the 2DEG resistor.

17. The UV light sensor of claim 14, wherein the heater comprises a polysilicon or metal structure formed over the cavity.

18. The UV light sensor of claim 13, further comprising a backside electrode located in the cavity and electrically coupled to the lower GaN layer.

19. The UV light sensor of claim 1, further comprising a front side electrode that extends through the upper GaN layer to contact the lower GaN layer.

20. A method of operating an ultraviolet (UV) light sensor comprising:
   applying a first voltage across a source contact and a drain contact located on an upper gallium nitride (GaN) layer, wherein the upper GaN layer is located on a lower GaN layer, wherein the lower GaN layer has a lower resistivity than the upper GaN layer, and wherein a two-dimensional electron gas (2DEG) conductive channel exists at an upper surface of the upper GaN layer, wherein the first voltage results in the formation of a drain depletion region that extends from the upper surface of the upper GaN layer to the lower GaN layer under the drain contact; then
   measuring an electrical current between the source contact and the drain contact while the first voltage is applied across the source contact and the drain contact, wherein the electrical current is a function of UV light received by the upper and lower GaN layers; and then
   refreshing the UV light sensor by applying a second voltage to the lower GaN layer when no electrical current is flowing between the source contact and the drain contact.

21. The method of claim 20 wherein the first voltage is in the range of 3 Volts to 50 Volts.

22. The method of claim 20, wherein refreshing the UV light sensor further comprises forcing current through a heater to increase the temperature of the upper and lower GaN layers.

23. The method of claim 22, where the current forced through the heater is in the range from 1 mA to 100 mA.

24. The method of claim 22, wherein refreshing the UV light sensor further comprises a sequence of forcing current through the heater and then applying the second voltage to the lower GaN layer.

25. The method of claim 22, wherein the heater comprises a 2DEG resistor in the upper GaN layer, wherein forcing current through the heater comprises applying the same voltage to both the 2DEG resistor and to the lower GaN layer.

26. The method of claim 20, wherein refreshing the UV light sensor further comprises applying 0 Volts to the drain contact while applying the second voltage to the lower GaN layer.

27. The method of claim 20, wherein the second voltage is in the range of 3 Volts to 50 Volts.

28. The method of claim 20, further comprising allowing the lower GaN layer to float while applying the first voltage across the source contact and the drain contact.

29. The method of claim 28, wherein applying the first voltage across the source contact and the drain contact comprises applying 0 Volts to the source contact and applying a first positive voltage to the drain contact.

30. The method of claim 29, further comprising applying the second voltage to the lower GaN layer in pulses having a first phase, and applying the first positive voltage to the drain contact in pulses having a second phase, opposite the first phase.

31. The method of claim 30, wherein the second voltage is a positive voltage.

32. The method of claim 30, where the pulses having the first phase have an amplitude in the range of 10 Volts to 50

Volts, and the pulses having the second phase have an amplitude in the range of 10 Volts to 50 Volts.

33. The method of claim 30, where the pulses having the first phase are rectangular pulses having a duration from 1 second to 1 microsecond, and the pulses having the second phase are rectangular pulses having a duration from 1 second to 1 microsecond.

34. An ultraviolet (UV) light sensor comprising:
   a first gallium nitride (GaN) layer formed over a nucleation layer;
   a first aluminum gallium nitride (AlGaN) layer formed over the first GaN layer, wherein a first two-dimensional electron gas (2DEG) conductive channel exists at an upper surface of the first GaN layer, adjacent to the first AlGaN layer;
   a second GaN layer formed over the first AlGaN layer; a second AlGaN layer formed over the second GaN layer, wherein a second two-dimensional electron gas (2DEG) conductive channel exists at an upper surface of the second GaN layer, adjacent to the second AlGaN layer;
   a source contact that extends through the second AlGaN layer and is electrically coupled to the second 2DEG conductive channel;
   a drain contact that extends through the second AlGaN layer and is electrically coupled to the second 2DEG conductive channel; and
   a drain depletion region that extends from the upper surface of the GaN layer to the first 2DEG conductive channel under the drain contact, wherein an electrical current between the source contact and the drain contact is a function of UV light received by the GaN layer.

35. The UV light sensor of claim 34, further comprising an electrode that provides an electrical connection to the first 2DEG conductive channel.

* * * * *